United States Patent [19]

Chin

[11] Patent Number: 4,518,442
[45] Date of Patent: May 21, 1985

[54] METHOD OF PRODUCING COLUMNAR CRYSTAL SUPERALLOY MATERIAL WITH CONTROLLED ORIENTATION AND PRODUCT

[75] Inventor: Herbert A. Chin, West Palm Beach, Fla.

[73] Assignee: United Technologies Corporation, Hartford, Conn.

[21] Appl. No.: 325,248

[22] Filed: Nov. 27, 1981

[51] Int. Cl.³ .......................... C22F 1/10; C22C 19/03
[52] U.S. Cl. ........................... 148/11.5 N; 148/11.5 P; 148/404
[58] Field of Search ............ 148/11.5 N, 11.5 P, 148/404, 426, 427, 428, 429, 409, 410

[56] References Cited

U.S. PATENT DOCUMENTS

| | | | |
|---|---|---|---|
| 3,346,427 | 10/1967 | Baldwin, Jr. et al. | 148/11.5 |
| 3,787,205 | 1/1974 | Church | 75/226 |
| 3,902,900 | 9/1975 | Restall | 75/171 |
| 3,920,489 | 11/1975 | Buchanan | 148/32 |
| 3,982,973 | 9/1976 | Peters et al. | 148/11.5 N |
| 3,992,161 | 11/1976 | Cairns et al. | 29/182.5 |
| 4,002,503 | 1/1977 | Bourne et al. | 148/11.5 P |

*Primary Examiner*—R. Dean
*Attorney, Agent, or Firm*—Charles E. Sohl

[57] ABSTRACT

A processing sequence is described for producing specific controlled elongated oriented crystal structures in nickel base superalloys. The method is performed in the solid state. Superalloy material is provided in a dense workable form. The material is cold straight rolled and cold cross rolled with intermediate anneals. This sequence produces a particular texture or preferred orientation in the rolled article. This textured article is then directionally recrystallized to produce the desired final microstructure comprised of aligned elongated grains of a particular controllable orientation.

9 Claims, 10 Drawing Figures

RSR185 CXR B68 (220)

M200 CXR M1-S (220)

METHOD OF PRODUCING COLUMNAR CRYSTAL SUPERALLOY MATERIAL WITH CONTROLLED ORIENTATION AND PRODUCT

The Government has rights in this invention pursuant to Contract No. F33615-80-C-5018 awarded by the Department of the Air Force.

DESCRIPTION

1. Technical Field

This invention relates to the field of nickel base superalloy articles having elongated aligned grains of controlled orientation and to methods for producing such articles.

3. Background Art

It is known that metallic materials generally have a crystalline form, that is to say, individual atoms of the material have predictable relationship to their neighboring atoms and this relationship extends in a repetitive fashion throughout a particular crystal or grain. Nickel base superalloys have a face centered cubic structure. It is also known that the properties of such crystals vary significantly with orientation.

Most metallic articles contain many thousands of individual crystals or grains and the properties of such an article in a particular direction are reflective of average orientation of the individual crystals which make up the article. If the grains or crystals have a random orientation then the article properties will be isotropic, that is equal in all directions. Although widely assumed, this is rarely the case since most casting and forming processes produce a preferred crystal orientation or texture. In a deformation situation such preferred orientation results from several factors. Crystals in certain orientations are more resistant to deformation than are other crystals. These deformation resistant oriented crystals tend to rotate during deformation thereby producing a preferred orientation. During recrystallization, preferred orientations result from the preferential nucleation and/or growth of grains of certain orientations.

Textures have been extensively studied and some practical uses have been made of textured materials. Particularly in the area of magnetic materials such as transformer steels, texturizing has produced substantial performance enhancements. This is described, for example, in U.S. Pat. No. 3,219,496 and in an article in Metal Progress, December 1953, p. 71–75.

In another area, methods have been developed for the production of nickel base articles having elongated grains using directional recrystallization techniques. This is described in U.S. Pat. No. 3,975,219. In this patent, hot extrusion is used to densify superalloy powder which is then isothermally forged and directionally recrystallized by passage through a thermal gradient. The patent does not indicate, what if any, preferred orientation resulted.

In another related area, the benefits of aligned grains of controlled orientation in aircraft gas turbine components are well known and are described in U.S. Pat. No. 3,260,505 which described such components and the methods of their production by casting techniques.

DISCLOSURE OF INVENTION

This invention has particular application to nickel base superalloys of the following broad composition range: 2–9% Al, 0–6% Ti, 0–16% Mo, 0–12% Ta, 0–12% W, 0–4% Cb, 0–20% Cr, 0–20% Co, 0–0.3% C, 0–1% Y, 0–0.3% B, 0–0.3% Zr, 0–2% V, 0–5% Re, balance essentially nickel. I believe the invention to be generally applicable to all nickel base superalloys. The starting material is provided in a workable form. One approach is to consolidate powder, another approach is to start with a casting, preferably a fine grain casting. This material is then hot worked at a temperature near but below the gamma prime solvus. Preferably this initial hot working is in an amount in excess of about 50%. This hot worked material is then cold rolled, in a particular fashion, a further amount, about 65%. The cold rolling step is performed as follows: the material is first cold rolled. A second cold rolling step is performed in the cross rolling direction, i.e., a direction 90° removed from the direction of initial cold rolling. The ratio of the reductions in the initial cold rolling step and final cold cross rolling step is about 75:25. Intermediate annealing steps are employed during both cold and hot rolling steps as necessary to prevent cracking. The result is an article having a strong $\{110\}$ $<112>$ sheet texture.

This textured material is directionally recrystallized to produce multiple elongated grains or single grains of a controlled orientation. The $\{110\}$ $<112>$ texture controls the orientation of the recrystallized grains. By varying the directional recrystallization parameters, a variety of final orientations can be produced.

Accordingly, this is the object of this invention to provide a method for producing nickel superalloy sheet having a strong $\{110\}$ $<112>$ sheet texture.

It is a further object of the invention to provide directionally recrystallized sheets comprised of grains whose $<111>$ direction is parallel to the cross rolling direction.

It is another object of the invention to provide sheets whose $<110>$ direction is parallel to the straight rolling direction.

And yet another object of the invention is to provide such sheets whose $<100>$ direction bisects the angle between the straight rolling and cross rolling direction.

The foregoing and other objects, features and advantages of the present invention will become more apparent from the following description of preferred embodiments and accompanying drawings.

BEST MODE FOR CARRYING OUT THE INVENTION

The starting material is a nickel base superalloy powder. Generally, any nickel base superalloy may be employed. The broad composition range of such alloys is:

2–9% Al, 0–6% Ta, 0–16% Mo, 0–12% Ta, 0–12% W, 0–4% Cb, 0–20% Cr, 0–20% Co, 0–2% V, 0–5% Re, balance essentially nickel. Other minor ingredients may be present including 0–0.3% C, 0–0.5% Hf, 0–0.3% Zr, 0–0.3% B and 0–1% Y. These alloys are processed by a method which will produce a homogeneous hot workable material. The starting material should be homogeneous, dense, and hot workable. One approach is to consolidate superalloy powder, for example, by hot isostatic pressure (HIP) or by hot extrusion. Another approach is to start with a cast body, preferably a fine grain casting. If the powder approach is employed, care must be taken to prevent contamination of the powder and preferably, the powder is maintained and handled under inert conditions which will eliminate oxidation of the powder particles. The powder is then compacted to form an article of full theoretical density. The method of compaction does not appear to be critical to the success of the invention. Typically hot isostatic pressing has been employed. The powder is sealed in an evacuated stainless steel can. Typical compaction conditions are gas pressures of about 15 ksi and temperatures of about 21°–2250° F. for a time of about two hours followed by a furnace cooling. Hot extrusion methods have also been successfully utilized. Typical extrusion conditions are tempratures of 2200°–2300° F. and extrusion ratios of greater than about 4:1. The powder is placed in a stainless steel container prior to extrusion.

The workable article is then hot deformed to achieve a reduction in area of at least 40% and preferably at least 55%. This hot deformation improves the subsequent cold workability of the material. Hot rolling has been employed but other processes such as forging appear equally applicable. The process described in U.S. Pat. No. 3,519,503 may be employed. The hot deformation is performed at a temperature which is near but less than the gamma prime solvus temperature of the alloy, typically 2150°–2275° F. If hot rolling is employed, initial hot rolling passes are preferably performed at the high end of the temperature range and with relatively low reductions per pass (i.e., 5%). Subsequent passes may be taken at greater reductions (i.e., 15%) and the temperature may be allowed to decrease towards the low end of the range. The article is reheated between passes as appropriate to maintain the alloy within the desired temperature range. At the end of the hot working step, the material may be left in the worked condition and allowed to air cool.

Figure 1:
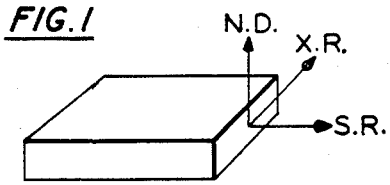
FIG. 1 shows the relation between the normal direction, straight rolling (S.R.) direction and cross rolling (X.R.) directions.
Figure 2:
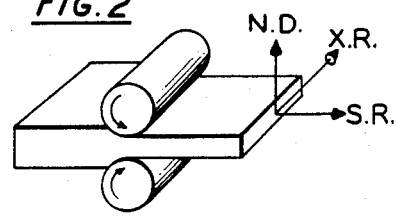
FIG. 2 shows the material orientation during straight rolling.
Figure 3:
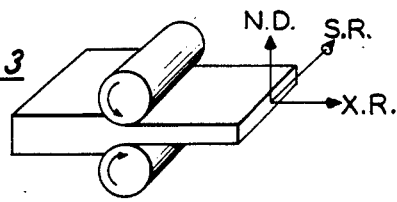
FIG. 3 shows the material orientation during cross rolling.

The next step is the one which is the most significant in developing the desired texture. This is a two-stage rolling operation which is referred to as cold rolling but which may be performed at temperatures of up to about 1200° F. This step may be understood through reference to FIG. 1 which shows the strip prior to the cold rolling operation and shows three orthogonal axes, SR, XR and ND. The cold rolling operation comprises two steps, in the first step rolling is performed in the SR (straight rolling) direction and in the second step the rolling proceeds in the XR (cross rolling) direction, i.e., at a 90° angle to the SR direction.

The two steps of the cold rolling operation must produce a total reduction of more than 55% and most preferably more than 65%. The amount of deformation is apportioned between the two cold rolling steps so that nominally, 75% of the deformation occurs in the initial straight rolling step and 25% occurs in the cross rolling step. It is the sequence of steps which yields the desired final texture. The typical reduction per pass is 1–2% and the total reduction between intermediate anneals (e.g. 2200° F. for three minutes) is 8–15%. The ratio between the cold straight rolling and cold cross rolling steps may vary from 80:20 to 70:30.

The result of this procedure is the development of a strong {110} <112> sheet texture. This means that a significant number of crystals in the sheet are oriented so that they have {110} planes parallel to the sheet surface and <112> directions which are parallel to the SR direction. Of course, in a random sheet a certain number of crystals would meet these criteria. However in sheets processed according to the preceding method, the number of crystals meeting this criteria is at least 4× and usually at least 6× greater than expected in the random case.

I have discovered that the sheet of this texture is highly receptive to directional recrystallization to produce recrystallized sheets whose orientation are different from the original texture and which are useful for the fabrication of superalloy articles as described in U.S. Pat. No. 3,872,563. The previously described {110} <112> sheet texture can be used to produce directionally recrystallized materials having either the <100>, <110> or <111> direction as a predominant direction in the sheet. I use the term directional recrystallization somewhat loosely and actually believe what occurs may be more accurately described as directional abnormal grain growth. That is to say, it seems likely that certain existing grains grow at the expense of other existing grains rather than the case of true directional recrystallization in which new grains would be nucleated and grow at the expense of the existing grains. Regardless of their origin it appears that differences in the rate of grain growth among competing grains produces the observed texture.

There are three primary crystal directions in the cubic system: the <100>, the <110> and the <111> representing respectively, an edge of the unit cell, the face diagonal of the unit cell and a diagonal running between opposite corners and passing through the center of the cell. The <100> orientation has a low elastic modulus and thus turbine components whose primary axis coincides with a <100> axis will be resistant to thermal fatigue. Similarly, the <111> direction has a high elastic modulus and articles having this direction parallel to the primary stress direction are resistant to high cyclic fatigue. Through the present invention and its ability to produce material with these different orientations, a high degree of flexibility is afforded the turbine component designer.

Figure 4:
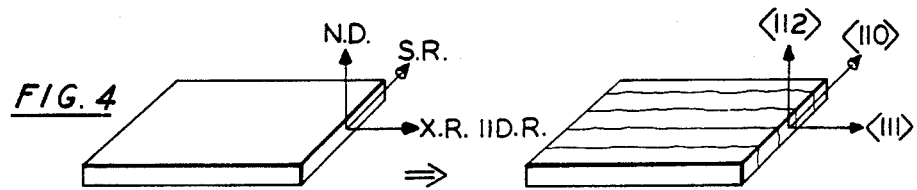
FIG. 4 shows the technique for producing a $<111>$ orientation material.
Figure 5:
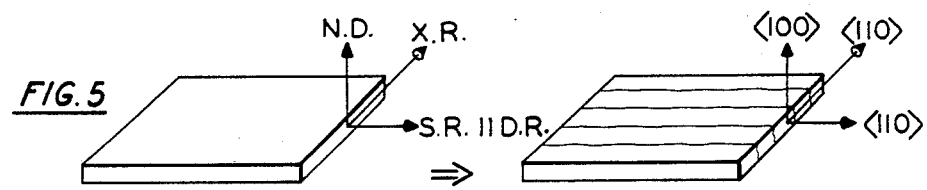
FIG. 5 shows the technique for producing a $<110>$ orientation material.
Figure 6:
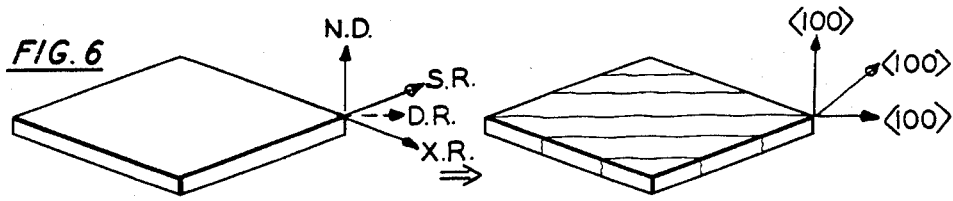
FIG. 6 shows the technique for producing a $<100>$ orientation material.

The method of producing sheet having these axes lying within the plane of the sheet is shown in FIGS. 4, 5 and 6. FIG. 4 shows that passing the sheet through a thermal gradient such that the direction of the gradient is parallel to the XR axis results in sheet consisting of elongated grains whose axis of elongation is the <111> direction. As shown in the Figure, the SR direction of the sheet contains <110> direction of the elongated crystals while the original normal direction of the sheet contains the <112> axis of the elongated crystals. In analogous fashion, FIG. 5 shows that if the sheet is passed through the thermal gradient so that SR axis is parallel to the direction of motion through the thermal gradient, the grains have an axis of <110> and a <110> axis lies in the XR direction and <100> axis lies in the ND direction. The procedure shown in FIG. 6 differs slightly in that the sheet passes through the thermal gradient along an axis which bisects the SR and XR direction resulting in the <100> direction by the elongation of the crystals and the two orthogonal axes being of the <100> type.

Typically, the required thermal gradient will have a steepness of at least about 100° F. measured at the gamma prime solvus temperature of the alloy. The hot end of the gradient will exceed the gamma prime solvus temperature but will obviously not exceed the incipient melting temperature of the alloy. Typical rates of traverse through the gradient will range from ⅛ to 4" per hours.

The present invention may be better understood by reference to the following examples which are intended to be illustrative rather than limiting:

EXAMPLE 1

Figure 7:
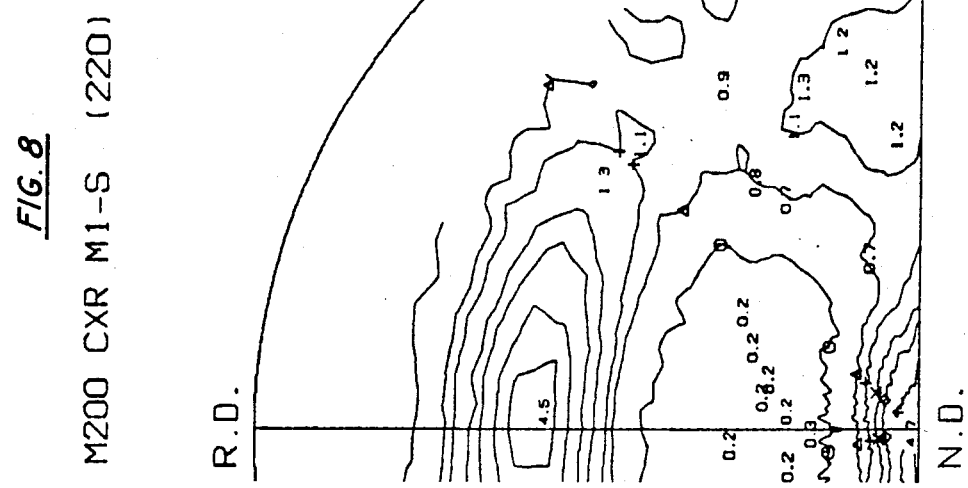
FIGS. 7 through 10 are pole figures illustrating the texture produced by the processes described in Example 1 through 4.

1. Composition—14.4% Mo, 6.25% W, 6.8% Al, 0.04% C, balance Ni.
2. Powder Size——80 mesh (U.S. Std. Sieve)
3. Consolidation Method—Hot Isostatic Pressing (H.I.P.) at 2250° F. and 15 ksi pressure for two hours.
4. Hot Working—by rolling at 2200° F. to 60% reduction.
5. Cold Rolling—total reduction 65%
   a. cold straight rolled
   b. cold cross rolled ratio of cold straight rolling to cold cross rolling=75:25, intermediate anneals at 2200° F.
6. Resultant Texture—singular {110} <112>, 7× random as shown in FIG. 7.
7. Directional Recrystallization (180° F./in gradient measured at gamma prime solvus temperature)
   a. D.R. parallel to cold cross rolling direction at ¼"/hr.—result—{112} in plane of sheet, <111> axial orientation.
   b. D.R. parallel to cold straight rolling direction at ⅝-2"/hr—result—{100} in plane of sheet, <110> in axial direction.
   c. D.R. in direction bisecting cold straight rolling and cold cross rolling directions (45° off axis) at ⅝-2"/hr—result—{100} in plane of sheet, <100> in axial direction.

EXAMPLE 2

Figure 8:
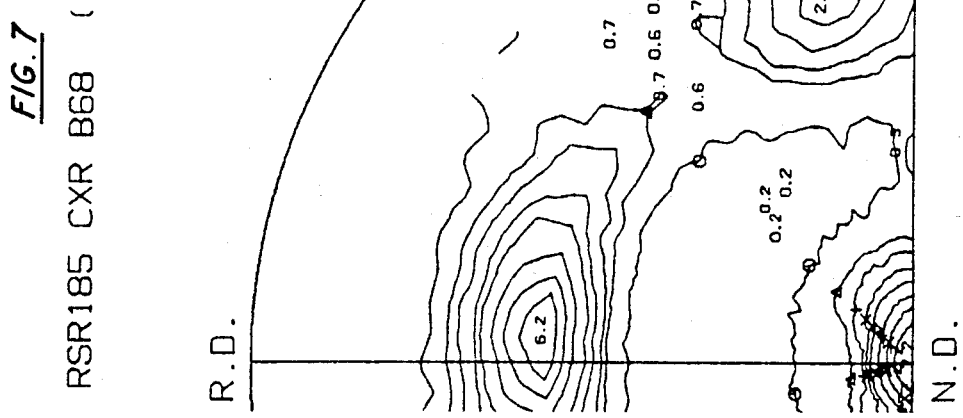

1. Composition—9.0% Cr, 5.0% Al, 10.0% Co, 2.0% Ti, 12% W, 1.0% Cb, 0.15% C, 0.015% B, 0.05% Zr (Alloy MAR-M200) balance Ni.
2. Powder Size——80 mesh (U.S. Std. Sieve)
3. Consolidation Method—Extrusion at 1950° F. at a 6.8:1 extrusion ratio.
4. Hot Working—by isothermal forging at 2050° F., strain rate of 0.1 min$^{-1}$, 60% total strain.
5. Cold Rolling—total reduction 60%
   a. cold straight rolled
   b. cold cross rolled ratio of cold straight rolling to cold cross rolling=75:25, intermediate anneals at 2100° F.
6. Resultant Texture—singular {110} <112>, 4.7× random as shown in FIG. 8.
7. Directional recrystallization not yet evaluated.

EXAMPLE 3

Figure 9:
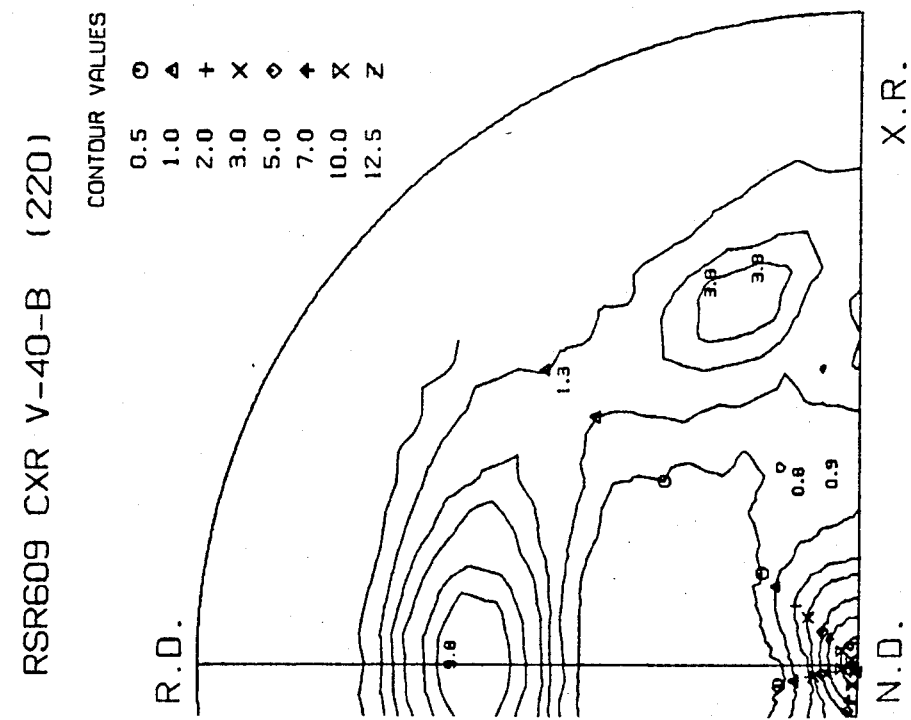

1. Composition—9.0% Cr, 7.0% Al, 9.5% W, 3.0% Ta, 1.0% Mo, balance Ni.
2. Powder Size——80 mesh (U.S. Std. Sieve)
3. Consolidation Method—Hot Isotatic Pressing (H.I.P.) at 2250° F. and 15 ksi pressure for two hours.
4. Hot Working—by rolling at 2200° F. to 60% reduction.
5. Cold Rolling—total reduction 65%
   a. cold straight rolled
   b. cold cross rolled ratio of cold straight rolling to cold cross rolling=75:25, intermediate anneals at 2200° F.
6. Resultant Texture—singular {110} <112>, 12× random as shown in FIG. 9.
7. Directional Recrystallization (180° F./in gradient measured at gamma prime solvus temperature)
   a. D.R. parallel to cold cross rolling direction at ¼"/hr.—result—{112} in plane of sheet, <111> axial orientation.
   b. D.R. parallel to cold straight rolling direction at ⅝-2"/hr—result—{100} in plane of sheet, <110> in axial direction.
   c. D.R. in direction bisecting cold straight rolling and cold cross rolling directions (45° off axis) at ⅝-2"/hr—result—{100} in plane of sheet, <100> in axial direction.

EXAMPLE 4

Figure 10:
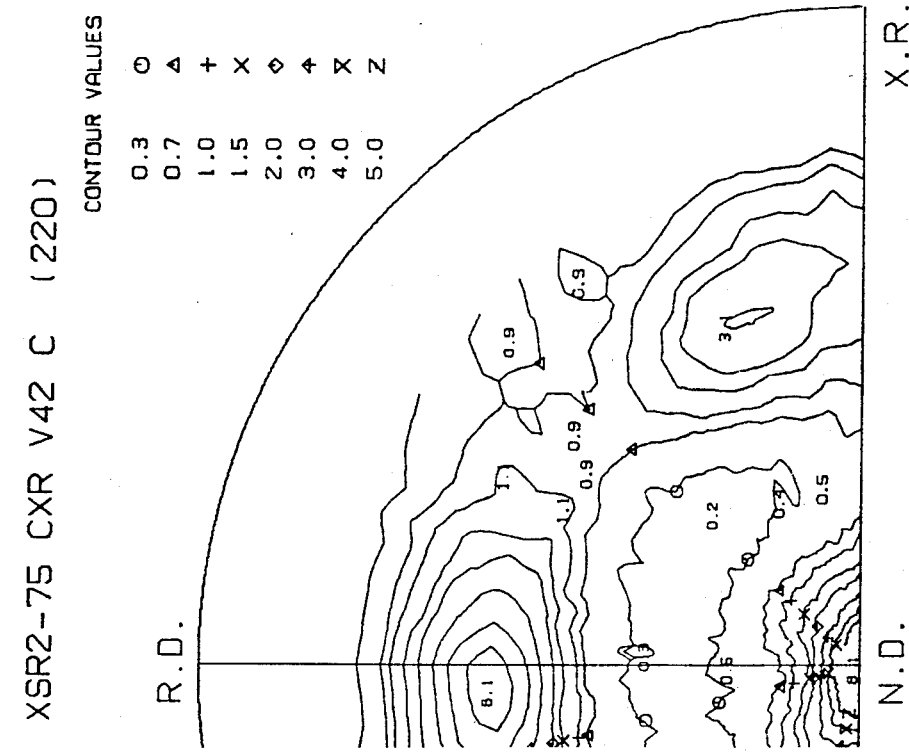

1. Composition—9.0% Cr, 6.5% Al, 9.5% W, 1.6% Ta, 1.0% Mo, 0.8% Cb, 0.05% C, 0.01% B, 0.1% Zr, balance Ni.
2. Powder Size——80 mesh (U.S. Std. Sieve)
3. Consolidation Method—Hot Isostatic Pressing (H.I.P.) at 2250° F. and 15 ksi pressure for two hours.
4. Hot Working—by rolling at 2200° F. to 60% reduction.
5. Cold Rolling—total reduction 65%
   a. cold straight rolled
   b. cold cross rolled ratio of cold straight rolling to cold cross rolling=75:25, intermediate anneals at 2200° F.
6. Resultant Texture—singular {110} <112>, 8× random as shown in FIG. 10.
7. Directional Recrystallization (180° F./in gradient measured at gamma prime solvus temperature)
   a. D.R. parallel to cold cross rolling direction at ¼"/hr.—result—{112} in plane of sheet, <111> axial orientation.
   b. D.R. parallel to cold straight rolling direction at ⅝-2"/hr—result—{100} in plane of sheet, <110> in axial direction.
   c. D.R. in direction bisecting cold straight rolling and cold cross rolling directions (45° off axis) at ⅝-2"/hr—result—{100} in plane of sheet, <100> in axial direction.

Although this invention has been shown and described with respect to a preferred embodiment, it will be understood by those skilled in the art that various changes in form and detail thereof may be made without departing from the spirit and scope of the claimed invention.

I claim:

1. A directionally recrystallized nickel base superalloy sheet comprised of aligned elongated grains with the <111> direction being parallel to the axis of elongation.

2. A directionally recrystallized nickel superalloy sheet comprised of aligned elongated grains with the <110> direction being parallel to the axis of elongation.

3. A directionally recrystallized nickel superalloy sheet comprised of aligned elongated grains with the <100> direction being parallel to the axis of elongation.

4. A method for producing nickel superalloy sheet comprised of aligned, elongated grains whose axis of elongation corresponds essentially to the <110> direction including the steps of
   a. providing a textured nickel superalloy sheet having a {110} <112> sheet texture with the <112> axis corresponding essentially to the (straight) rolling direction
   b. passing the sheet through a thermal gradient, whose hot end exceeds the recrystallization temperature of the alloy in the straight rolling direction, so as to effect directional recrystallization
whereby the resultant sheet will contain elongated grains whose axis of elongation is a first <110> direction with a second <110> direction being parallel to the cross rolling direction and a <100> direction being normal to the sheet, said first <110> direction, said second <110> direction and said <100> direction being orthogonal.

5. The product produced according to the method of claim 4.

6. A method for producing nickel superalloy sheet comprised of aligned, elongated grains whose axis of elongation corresponds essentially to the <111> direction including the steps of
   a. providing a textured nickel superalloy sheet having a {110} <112> sheet texture with the <112> axis corresponding essentially to the (straight) rolling direction
   b. passing the sheet through a thermal gradient, whose hot end exceeds the recrystallization temperature of the alloy in the cross rolling direction, so as to effect directional recrystallization
whereby the resultant sheet will contain elongated grains whose axis of elongation is a <111> direction and parallel to the cross rolling direction with a <110> direction lying in the sheet and parallel to the straight rolling direction and a <112> direction being normal to the sheet, said <111> direction, said <110> direction and said <112> direction being orthogonal.

7. The product produced according to the method of claim 6.

8. A method for producing nickel superalloy sheet comprised of aligned, elongated grains whose axis of elongation corresponds essentially to the <100> direction including the steps of
   a. providing a textured nickel superalloy sheet having a {110} <112> sheet texture with the <112> axis corresponding essentially to the (straight) rolling direction
   b. passing the sheet through a thermal gradient, whose hot end exceeds the recrystallization temperature of the alloy in a direction which bisects the straight rolling and cross rolling directions, so as to effect directional recrystallization
whereby the resultant sheet will contain elongated grains whose axis of elongation is parallel to the direction of passage through the thermal gradient and is a <100> direction with a second <100> direction lying in the sheet and a third <100> direction being normal to the sheet, all of said <100> directions being orthogonal.

9. The product produced according to the method of claim 8.

* * * * *